United States Patent
Moberg et al.

(10) Patent No.: US 10,389,960 B2
(45) Date of Patent: Aug. 20, 2019

(54) IMAGE SENSOR WITH GLOW SUPPRESSION OUTPUT CIRCUITRY

(71) Applicant: SEMICONDUCTOR COMPONENTS INDUSTRIES, LLC, Phoenix, AZ (US)

(72) Inventors: Gregory Oscar Moberg, Rochester, NY (US); Christopher Parks, Pittsford, NY (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 87 days.

(21) Appl. No.: 15/149,330

(22) Filed: May 9, 2016

(65) Prior Publication Data
US 2017/0208283 A1    Jul. 20, 2017

Related U.S. Application Data

(60) Provisional application No. 62/279,185, filed on Jan. 15, 2016.

(51) Int. Cl.
*H04N 5/372* (2011.01)
*H04N 5/3728* (2011.01)
(Continued)

(52) U.S. Cl.
CPC ......... *H04N 5/37206* (2013.01); *G11C 19/00* (2013.01); *G11C 19/282* (2013.01); *H01L 27/14612* (2013.01); *H01L 27/14636* (2013.01); *H01L 27/14689* (2013.01); *H01L 27/14806* (2013.01); *H01L 27/14831* (2013.01); *H04N 5/357* (2013.01); *H04N 5/359* (2013.01);
(Continued)

(58) Field of Classification Search
CPC .. H04N 5/37206; H04N 5/359; H04N 5/3698; H04N 5/357; H04N 5/3728; G11C 19/00; G11C 19/282; H01L 27/14689; H01L 27/14831
See application file for complete search history.

(56) References Cited

U.S. PATENT DOCUMENTS 5,280,511 A    1/1994  Fujii et al.
5,614,740 A    3/1997  Gardner et al.
(Continued)

FOREIGN PATENT DOCUMENTS

JP    2009260702 A  * 11/2009

*Primary Examiner* — Ahmed A Berhan
(74) *Attorney, Agent, or Firm* — Treyz Law Group, P.C.; Joseph F. Guihan

(57) ABSTRACT

A charge-coupled device (CCD) image sensor is provided. The CCD image sensor may include an array of photosensors that transfer charge to multiple vertical CCD shift registers, which then in turn transfer the charge to a horizontal CCD shift register. The horizontal CCD shift register then feeds an output buffer circuit. The output buffer circuit can include multiple output stages, each of which can include a source-follower transistor coupled in series with a current sink transistor and at least one cascode transistor. The current sink transistor may have its gate terminal shorted to ground. In one arrangement, the cascode transistor has a gate terminal that receives a non-zero bias voltage. In another arrangement, the cascode transistor has a gate terminal that is also shorted to ground and operates in depletion mode.

15 Claims, 6 Drawing Sheets

(51) Int. Cl.
*H04N 5/357* (2011.01)
*G11C 19/28* (2006.01)
*H01L 27/148* (2006.01)
*H01L 27/146* (2006.01)
*G11C 19/00* (2006.01)
*H04N 5/378* (2011.01)
*H04N 5/369* (2011.01)
*H04N 5/359* (2011.01)

(52) U.S. Cl.
CPC ........... *H04N 5/3698* (2013.01); *H04N 5/372* (2013.01); *H04N 5/378* (2013.01); *H04N 5/3728* (2013.01)

(56) References Cited

U.S. PATENT DOCUMENTS

| | | |
|---|---|---|
| 6,590,238 B1 | 7/2003 | Parks |
| 7,012,646 B2 | 3/2006 | Parks |
| 7,804,328 B2 | 9/2010 | Pentakota et al. |
| 8,524,487 B2 * | 9/2013 | Fife .................... G01N 27/4145 257/253 |
| 2011/0074996 A1 | 3/2011 | Wang et al. |

* cited by examiner

IMAGE SENSOR WITH GLOW SUPPRESSION OUTPUT CIRCUITRY

CROSS-REFERENCE TO RELATED APPLICATION(S)

This application claims priority to U.S. Provisional Application No. 62/279,185, filed on Jan. 15, 2016, entitled "Image Sensor with Glow Suppression Output Circuitry," invented by Gregory Oscar Moberg and Christopher Parks, and is incorporated herein by reference and priority thereto for common subject matter is hereby claimed.

BACKGROUND

This relates generally to imaging systems and, more particularly, to charge-coupled device (CCD) imaging systems.

Electronic devices such as cellular telephones, cameras, and computers often include imaging systems that include digital image sensors for capturing images. Image sensors may be formed having a two-dimensional array of image pixels that contain photodiodes that convert incident photons (light) into electrical signals. Electronic devices often include displays for displaying captured image data.

Conventional interline CCD imagers are provided with rows and columns of photodiodes. Each column of photodiodes generate charge that is transferred to a corresponding vertical CCD (VCCD). The charge is then read out from each VCCD to a horizontal CCD (HCCD), where the charge can then fed to an associated output circuit. The output circuit typically includes only a single transistor in its current sink path. In this configuration, the single transistor in the current sink path will often experience a high voltage drop of up to 10 volts or more across its source-drain terminals. This excessively high voltage across its source-drain terminals can result in light being emitted from the current sink transistor, which is manifested as an undesired glow in the final image in the region near the output circuit.

It is within this context that the embodiments herein arise.

DETAILED DESCRIPTION

Figure 1:
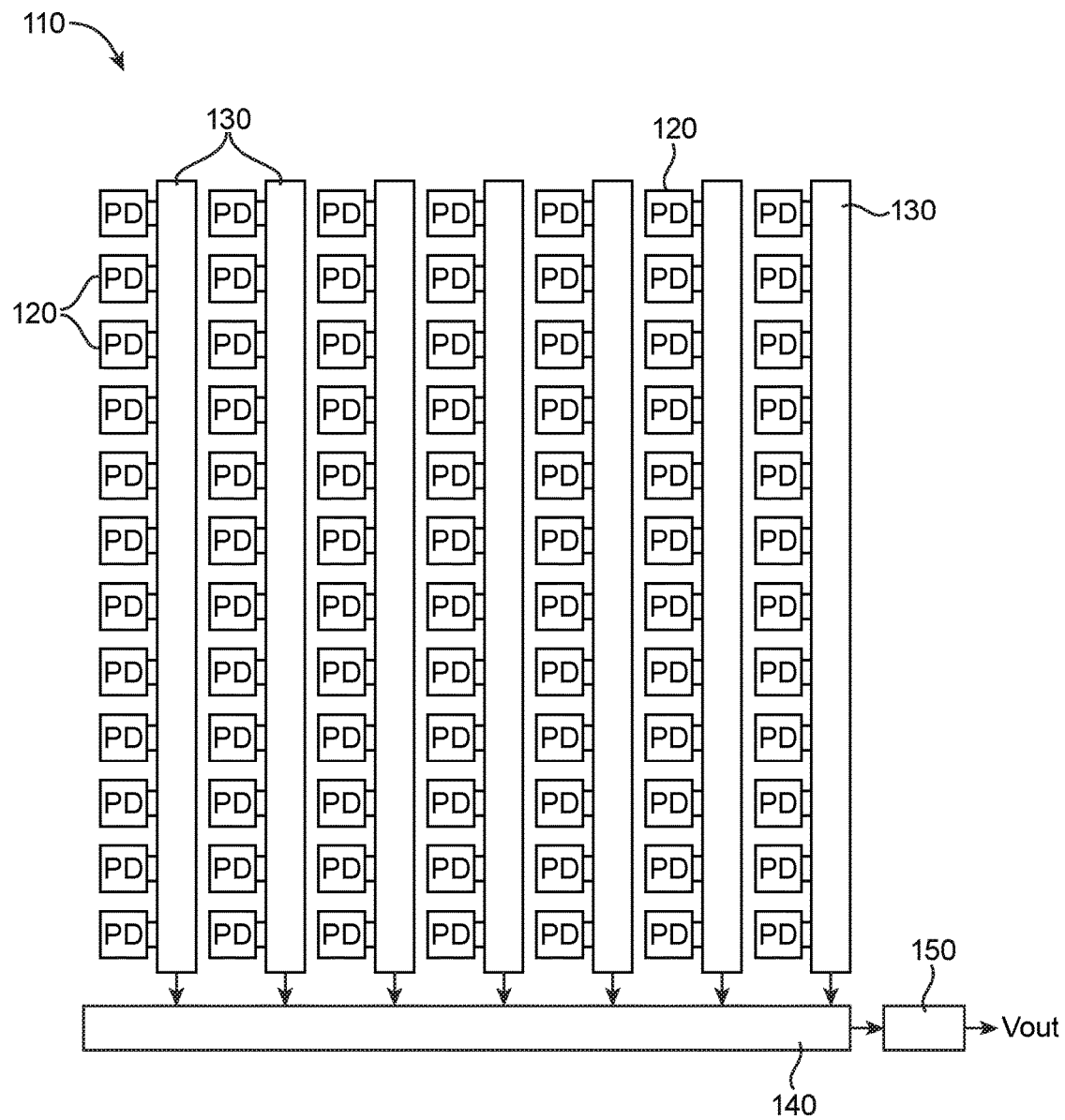
FIG. 1 is a block diagram of a charge-coupled device (CCD) image sensor in accordance with an embodiment.

FIG. 1 is a diagram of the basic configuration of an interline charge-coupled device (CCD) image sensor 110. Image sensor 110 may integrated into a vehicle safety system (e.g., a rear-view camera or other vehicle safety system), a surveillance system, an electronic device such as a camera, a cellular telephone, a video camera, or any other desired electronic device that captures digital image data.

Image sensor 110 may include an array of photosensitive elements such as photodiodes 120 arranged in rows and columns. Photodiodes 120 may each be associated with an image pixel and may be therefore be interchangeably referred to as "pixel photodiodes." Light filtering elements such as color filters, plasmonic light filters, resonance enhanced color filters, or any other filter elements may be formed over each of photodiodes 120. Lens elements such as microlenses may also be formed over photodiodes 120.

Each column of photodiodes 120 in image sensor 110 may be associated with a respective vertical CCD (VCCD) shift register 130. Image sensor 110 may also include a horizontal CCD (HCCD) shift register, which may be coupled to an output amplifier 150. Output amplifier 150 can generate an output signal Vout that is fed to additional image readout and processing circuitry (not shown). In a progressive scan readout mode, every photodiode 120 in each column may simultaneously transfer some or all of the photo-generated charge collected in the photodiode during an image capture mode to their respective VCCD shift registers 130. As an example, some or all of the photo-generated charge from photodiodes 120 in a first column of image sensor 110 may be transferred to a first VCCD shift register 130, while some or all of the photo-generated charge from photodiodes 120 in a second column of image sensor 110 may be transferred to a second VCCD shift register 130 at the same time.

Charge in vertical shift registers 130 may be read out by transferring all columns in parallel, one row at a time, into HCCD shift register 140. As an example, charge associated with every row of all the VCCDs 130 associated with every column in the image sensor may be transferred one row towards the HCCD 140. At the same time, charge associated with the first row of image sensor 110 adjacent to the HCCD 140 is transferred from VCCDs 130 to HCCD 140. Each row of charge will be successively shifted from vertical shift registers 130 into horizontal shift register 140 until the entire array has been read out, and the entire process repeats.

Once HCCD shift register 140 receives charge associated with a given row from VCCD shift registers 130, register 140 may then serially transfer charge to an output circuit such as output buffer (or amplifier) 150. To increase frame rate, interline CCDs may have more than one output amplifier (not shown). In some instances, register 140 may be duplicated at the opposite side or one or more corners of image sensor 110 (e.g., for multi-output read out operations). The duplicate HCCD register may serve the same purpose and may have the same functionality as HCCD shift register 140.

The use of photodiodes in image sensor 110 of FIG. 1 is merely illustrative and does not limit the scope of the present invention. In other suitable arrangements, the image sensor may be interline CCDs, full frame CCDs, time delayed integration (TDI) CCDs, or other suitable types of image sensors that do not necessarily include a separate array of photodiodes.

Figure 2:
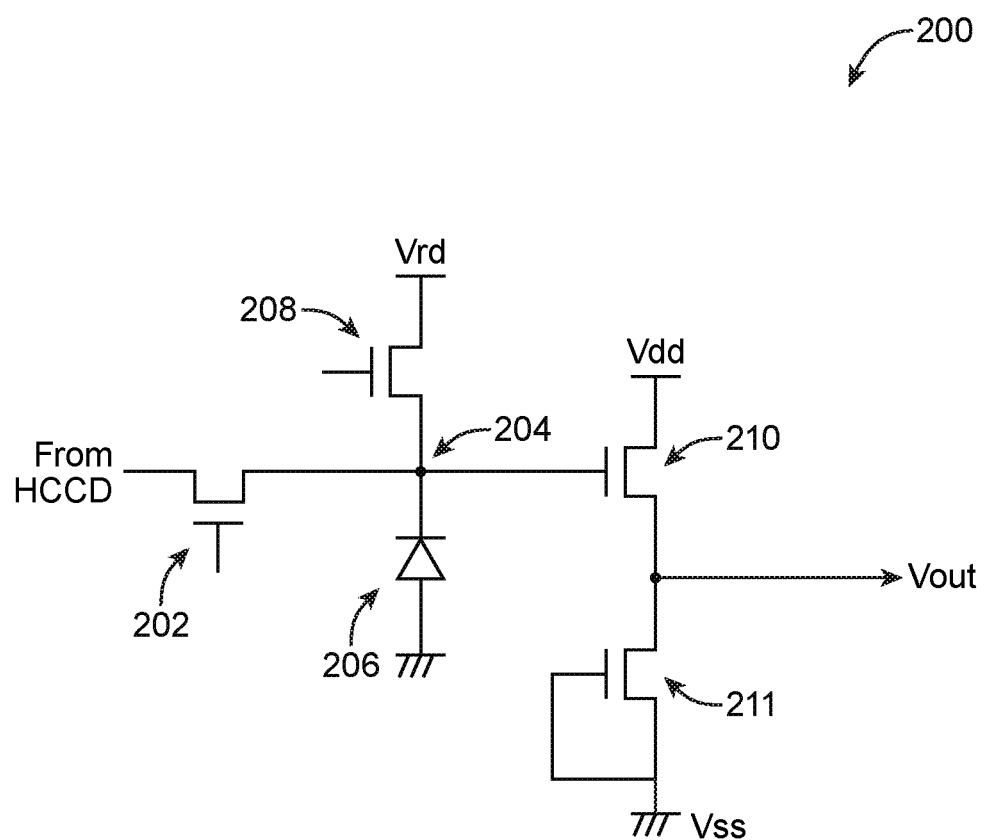
FIG. 2 is a circuit diagram on a conventional output circuit.

FIG. 2 is a circuit diagram of a conventional output circuit 200. As shown in FIG. 2, output circuit 200 includes output gate transistor 202 electrically connected between charge-to-voltage conversion region 204 and a horizontal CCD shift register (now shown). Reset transistor 208, floating diffusion diode 206, and a gate of amplifier transistor 210 are also connected to node 204. Charge-to-voltage conversion region 204 and amplifier transistor 210 convert the accumulated charge to an analog voltage signal Vout. A single current sink transistor 211 is coupled in series with amplifier transistor 210.

Figure 3:
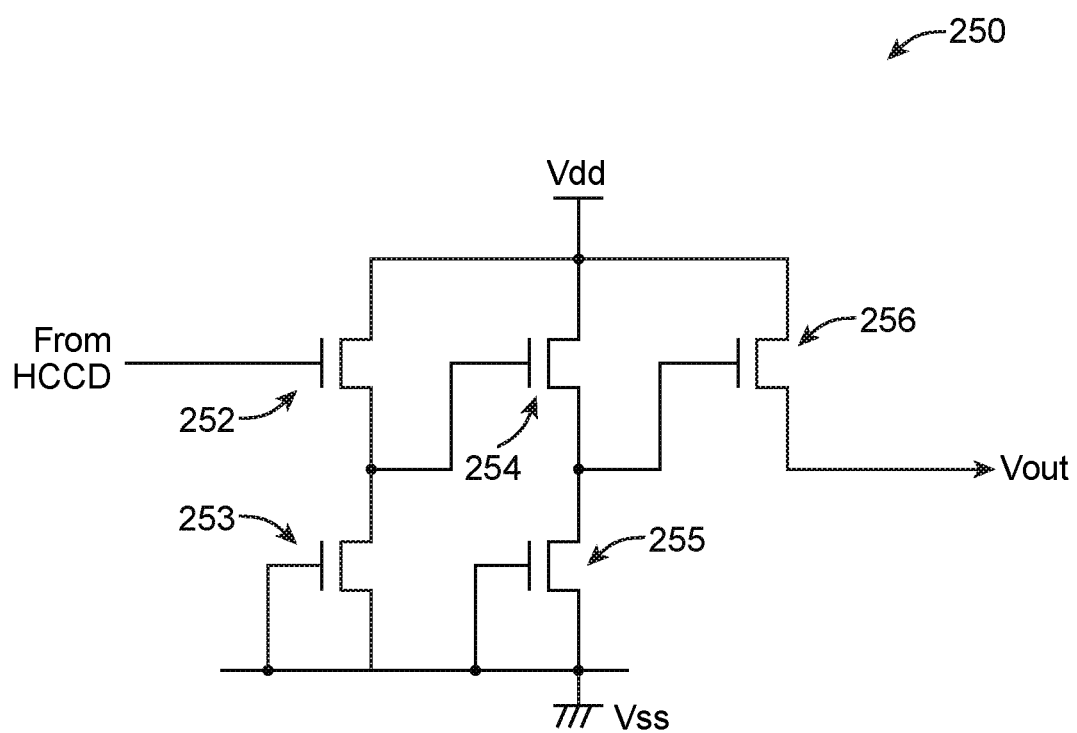
FIG. 3 is a circuit diagram of a multistage output circuit.

The output circuit can sometimes include multiple stages to help drive the output load. FIG. 3 is a circuit diagram of multistage output circuit 250. The output gate transistor, reset transistor, and the charge-to-voltage conversion region are not shown so as to not unnecessarily obscure the configuration of FIG. 3. As shown in FIG. 3, output circuit 250 includes a first output stage with amplifier transistor 252 and current sink transistor 253 connected in series, a second output stage with amplifier transistor 254 and current sink transistor 255 connected in series, and a third output stage with amplifier transistor 256 driving output signal Vout.

Assuming small gate-to-source voltage levels for transistors 252, 254, and 256, the voltage appearing across current sink transistors 253 and 255 can be fairly high, typically between 8V and 10V. This high voltage gradient across the source-drain terminals of these current sink transistors results in a high electric field to be generated at the gate edge near the drain terminal, which causes electrons to be promoted to the conduction band. When these electrons recombine with holes, they emit photons. Light is therefore emitted from current sink transistors 253 and 255 due to the electric field in the drain region next to the gate terminal. Light generation in the output buffer circuit is sometimes referred to as "amplifier glow." This gradient does not necessarily damage the current sink transistors, but the amount of light produced is sufficient to measurably affect the dark floor of the image sensor, especially in high sensitivity devices such as electron multiplication CCDs.

In accordance with an embodiment of the present invention, one or more cascode transistors can be inserted in the current sink path to help distribute the voltage gradient among multiple transistors in the current sink path so that the source-drain voltages across each current sink transistor is reduced. By effectively dividing down the source-drain voltage across multiple cascode transistors, the light emission from each cascode transistor is substantially reduced. The amplifier glow can therefore be controlled by inserting a desired number of cascode transistors in each current sink path in the output buffer circuit.

Figure 4:
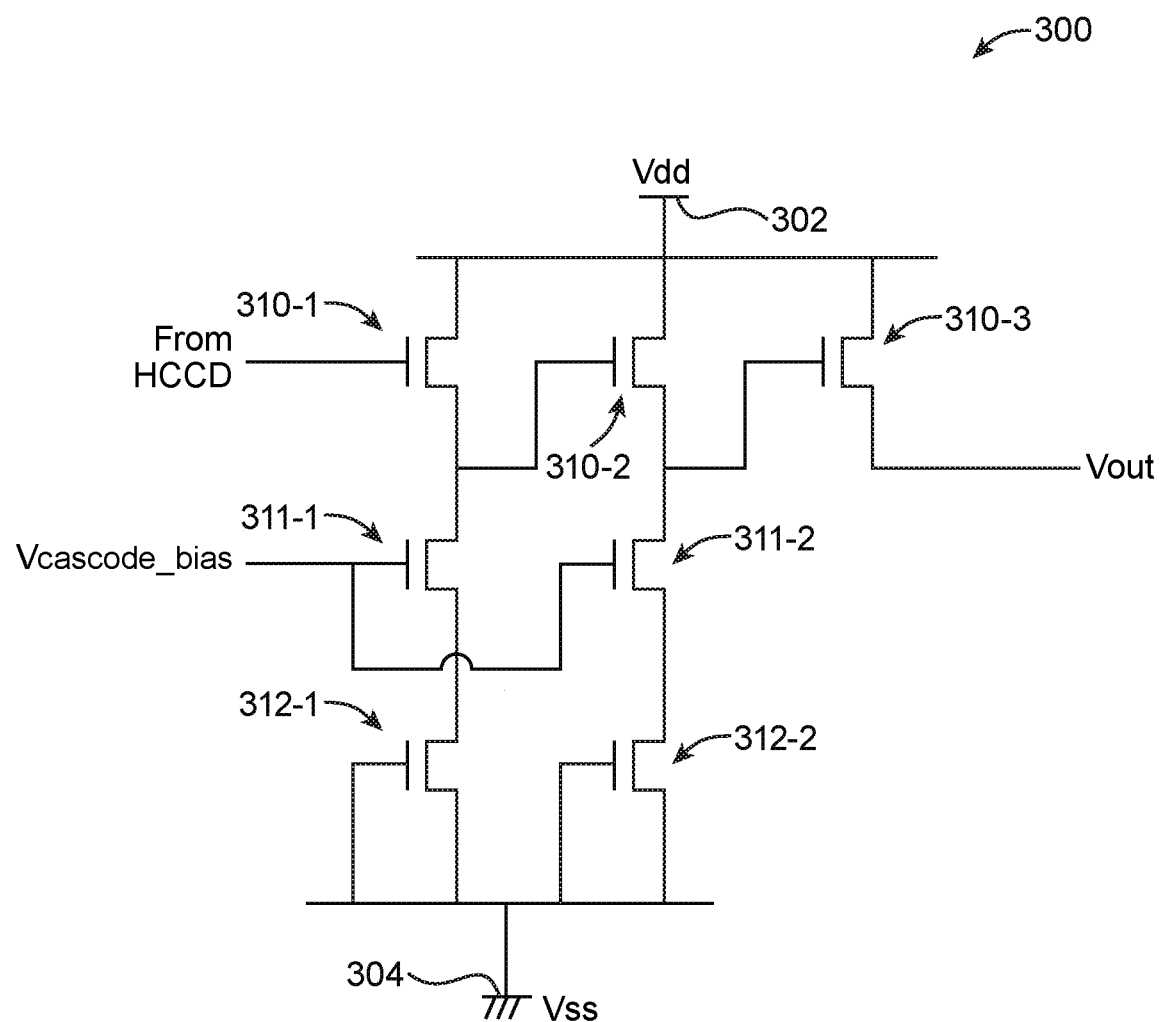
FIG. 4 is a circuit diagram of an illustrative multistage output circuit with cascode current sink in accordance with an embodiment.

FIG. 4 is a circuit diagram of an illustrative multistage output circuit with cascode current sink. As shown in FIG. 4, output circuit 300 can include a first output stage having an amplifier transistor 310-1, a current sink transistor 312-1, and cascode transistor 311-1 coupled together in series between positive power supply line 302 (e.g., a power supply line on which positive power supply voltage Vdd is provided) and ground power supply line 304 (e.g., a power supply line on which ground power supply voltage Vss is provided). Output circuit 300 may also include a second output stage having amplifier transistor 310-2, current sink transistor 312-2, and cascode transistor 311-2 coupled in series between power supply lines 302 and 304. The current sink and cascode transistors in the pull-down current path are sometimes referred to as "pull-down" transistors. Output circuit 300 may also include a third output stage with amplifier transistor 310-3 that drives output signal Vout. Amplifier transistors 310-1, 310-2, and 310-3 are sometimes referred to as "source-follower" transistors.

In particular, current sink transistors 312-1 and 312-2 in the first and second output stages have gate terminals that are connected to ground line 304. Cascode transistors 311-1 and 311-2 in the first and second output stages both receives cascode bias voltage Vcascode_bias. In general, the transistors in the second output stage are larger than the transistors in the first output stage, and transistors 310-3 in the third output stage is larger than each transistors in the second output stage. Voltage Vcascode_bias can be carefully selected such that the voltage across current sink transistors 312-1 and 312-2 is effectively reduced by half. This reduction of the source-drain voltage will reduce the amplifier glow generated by output buffer circuit 300 and can also help reduce noise. Additionally, insertion of cascode transistors 311-1 and 311-2 will greatly increase the output impedance of each current sink path, which raises the gain of the first and second output stages, and can also help increase the linearity of output circuit 300.

Figure 5:
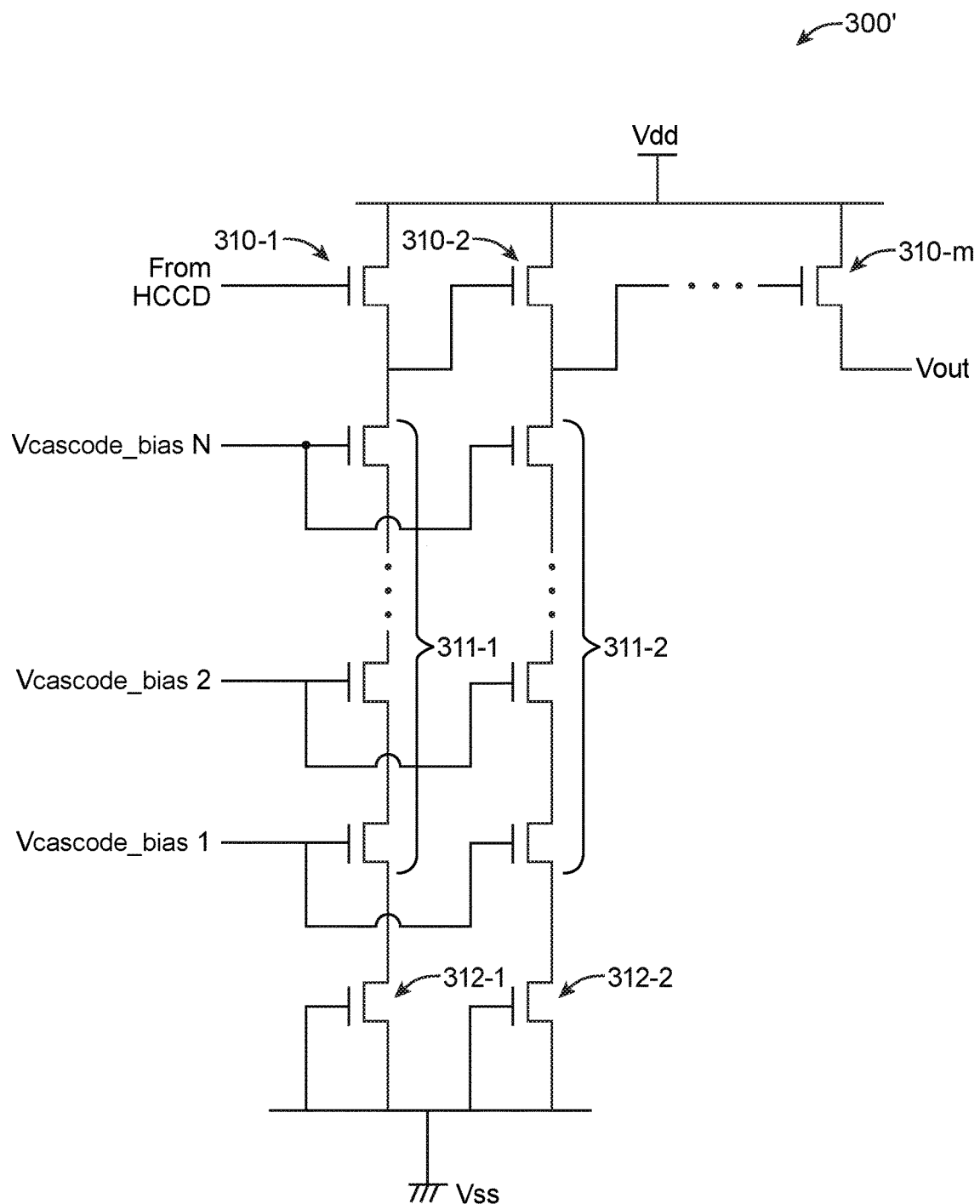
FIG. 5 is a circuit diagram of an illustrative output circuit with multiple cascode current sink transistors biased using different voltage levels in accordance with an embodiment.

In accordance with another suitable arrangement, an output buffer circuit such as output circuit 300' can include more than one cascode transistor in each output stage (see, e.g., FIG. 5). As shown in FIG. 5, output circuit 300' can have m stages, where m can be equal to three, four, five, or any suitable integer. The first output stage may include source follower transistor 310-1, current sink transistor 312-1, and a first string of cascode transistors 311-1 coupled in series between the positive and ground power supply lines. The second output stage may include source follower transistor 310-2, current sink transistor 312-2, and a second string of cascode transistors 311-2 coupled in series between the positive and ground power supply lines. The other output stages (now shown) in output circuit 300' may also include strings of multiple inserted cascode transistors. In general, the transistors in each successive output stage is larger than the transistors in the preceding output stage. For example, the first string of cascode transistors 311-1 may have identical sizes but may be smaller than each cascode transistor in the second string 311-2. The current sink transistors and each cascode transistors in the strings may all be referred to as pull-down transistors.

The current sink transistors (e.g., current sink transistors 312-1 and 312-2) in each output stage may have gate terminals that are shorted to the ground power supply line. In particular, a first cascode transistor in each string may have a gate terminal that receives cascode bias voltage Vcascode_bias1; a second cascode transistor in each string may have a gate terminal that receives cascode bias voltage Vcascode_bias2; . . . ; and an n-th cascode transistor in each string may have a gate terminal that receives cascode bias voltage Vcascode_biasN. If desired, n can be equal to two, three, four, five, or any suitable integer. In general, Vcascode_bias1<Vcascode_bias2< . . . <Vcascode_biasN. These bias voltages can therefore be generated using a resistor divider between the power supply lines (as an example). This is merely illustrative. Other means such as stacked diode-connected transistors can also be used.

Figure 6:
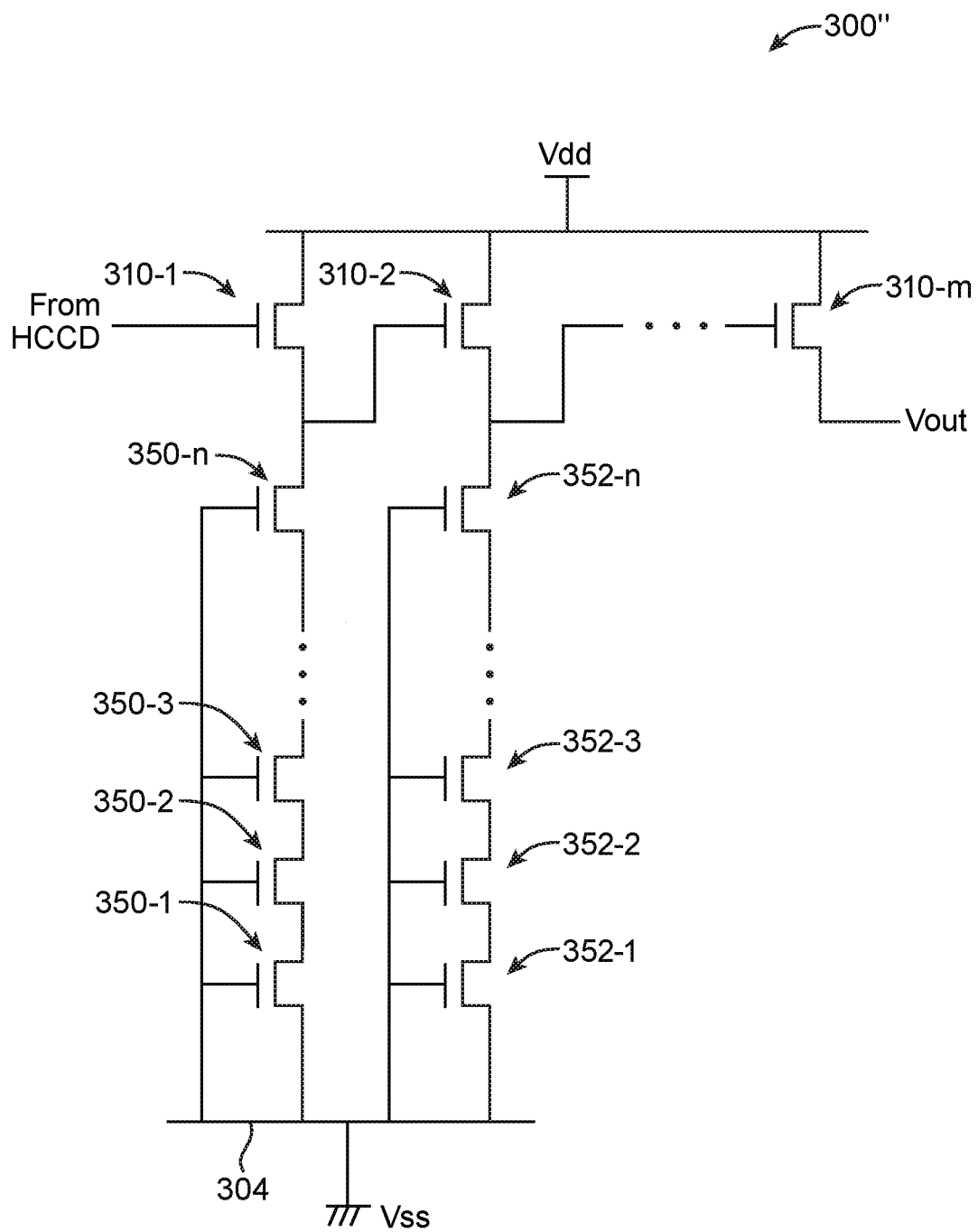
FIG. 6 is a circuit diagram of an illustrative output circuit with multiple cascode current sink transistors in depletion mode in accordance with an embodiment.

In accordance with yet another suitable arrangement, an output buffer circuit such as output buffer circuit 300" can include more than one cascode transistor in each output stage operating in depletion mode (see, e.g., FIG. 6). As shown in FIG. 6, output circuit 300" can have m stages, where m can be equal to three, four, five, or any suitable integer. The first output stage may include source follower transistor 310-1 and n current sink transistors 350 (e.g., transistors 350-1, 350-2, 350-3, . . . , and 350-n) coupled in series between the positive and ground power supply lines. Similarly, the second output stage may include source follower transistor 310-2 and n current sink transistors 352 (e.g., transistors 352-1, 352-2, 352-3, . . . , and 352-n) coupled in series between the positive and ground power supply lines. The other output stages (now shown) in output circuit 300" may also include strings of multiple inserted cascode transistors.

Each of the n current sink transistors 350 in the first output stage and each of the n current sink transistors 352 in the second output stage may have gate terminals that are shorted to ground line 304. Connected in this way, each of transistors 350 and 352 may be operated in depletion mode. In particular, the threshold voltages of these current sink transistors may be adjusted to produce the desired set of voltages at their sources (e.g., using different channel dopant implants). For example, transistors 350-1 and 352-1 may have a threshold voltage that is set to −1 V, whereas transistors 350-2 and 352-2 may a threshold voltage that is set to −3V.

Various embodiments have been described illustrating CCD image sensors. CCD image sensors having output buffer circuits with cascode transistors may be used in an imaging system such as an electronic device.

In accordance with an embodiment, an image sensor is provided that includes a plurality of photosensitive elements, a plurality of vertical shift registers that receives charge from the plurality of photosensitive elements, a horizontal shift register that receives the charge from the plurality of vertical shift registers, and an output buffer circuit that receives the charge from the horizontal shift register and that includes a current sink transistor and a cascode transistor. The current sink transistor and the cascode transistor may be coupled in series. The output buffer circuit may also include an amplifier transistor coupled in series with the current sink transistor and the cascode transistor.

The current sink transistor has a gate terminal that can be shorted to a ground power supply line. In one variation, the cascode transistor has a gate terminal that is connected to a voltage bias terminal that is different than the ground power supply line. In another variation, the cascode transistor has a gate terminal that is also shorted to the ground power supply line.

In accordance with another embodiment, a method of forming an image sensor is provided that includes arranging a plurality of photodiodes in an array, coupling the plurality of photodiodes to a plurality of vertical shift registers, coupling the plurality of vertical shift registers to a horizontal shift register, forming an output buffer that includes a first output stage and a second output stage, and coupling the horizontal shift register to the output buffer. In particular, the first and second output stages may each include at least two pull-down transistors.

The at least two pull-down transistors may include a current sink transistor and a cascode transistor that are coupled in series. An amplifier transistor (sometimes referred to as a source-follow transistor) may also be coupled in series with the current sink transistor and the cascode transistor. The gate terminal of the amplifier transistor may be coupled to the horizontal shift register.

In accordance with another suitable embodiment, a charge-coupled device (CCD) image sensor is provided that includes an array of photodiodes, a plurality of vertical CCD shift registers coupled to the array of photodiodes, a horizontal CCD shift register coupled to the plurality of vertical CCD shift registers, and an output buffer circuit that receives signals from the horizontal CCD shift register and that includes a first output stage and a second output stage. The first output stage may include a source follower transistor, a current sink transistor, and a cascode transistor coupled in series. The second output stage may also include a source follower transistor, a current sink transistor, and a cascode transistor coupled in series.

The current sink transistors of the first and second output stages may have gate terminals that are shorted to ground. The one suitable arrangement, the cascode transistors of the first and second output stages have gate terminals that are also shorted to ground. In another suitable arrangement, the cascode transistors of the first and second output stages have gate terminals that are not shorted to ground.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor, comprising:
   an array of image pixels arranged in rows and columns;
   a plurality of vertical shift registers, wherein each column of image pixels in the array of image pixels is coupled to a respective vertical shift register of the plurality of vertical shift registers;
   a horizontal shift register that receives charge from the plurality of vertical shift registers; and
   an output buffer circuit that receives the charge from the horizontal shift register and that includes a current sink transistor, a cascode transistor, and an amplifier transistor, wherein the amplifier transistor has a gate terminal that receives signals from the horizontal shift register, and wherein the amplifier transistor is coupled in series with the current sink transistor and the cascode transistor.

2. The image sensor of claim 1, wherein the current sink transistor has a gate terminal that is shorted to a ground power supply line.

3. The image sensor of claim 2, wherein the cascode transistor has a gate terminal that is connected to a voltage bias terminal that is different than the ground power supply line.

4. The image sensor of claim 2, wherein the cascode transistor has a gate terminal that is also shorted to the ground power supply line.

5. The image sensor of claim 1, wherein the output buffer circuit further comprises:
   an additional cascode transistor that is connected in series with the cascode transistor.

6. The image sensor defined in claim 1, wherein the cascode transistor is interposed between the amplifier transistor and the current sink transistor.

7. A charge-coupled device (CCD) image sensor, comprising:
   an array of pixels arranged in columns;
   a plurality of vertical CCD shift registers, wherein each vertical CCD shift register is coupled to a respective column of the array of pixels;
   a horizontal CCD shift register coupled to the plurality of vertical CCD shift registers; and
   an output buffer circuit that receives signals from the horizontal CCD shift register and that includes a first output stage and a second output stage, wherein the first output stage includes a source follower transistor, a current sink transistor, and a cascode transistor coupled in series and wherein the second output stage also includes a source follower transistor, a current sink transistor, and a cascode transistor coupled in series.

8. The CCD image sensor of claim 7, wherein the current sink transistors of the first and second output stages have gate terminals that are shorted to ground.

9. The CCD image sensor of claim 8, wherein the cascode transistors of the first and second output stages have gate terminals that are also shorted to ground.

10. The CCD image sensor of claim 8, wherein the cascode transistors of the first and second output stages have gate terminals that are not shorted to ground.

11. A charge-coupled device (CCD) image sensor, comprising:
   an array of pixels arranged in columns;
   a plurality of vertical CCD shift registers, wherein each vertical CCD shift register is coupled to a respective column of the array of pixels;
   a horizontal CCD shift register coupled to the plurality of vertical CCD shift registers; and
   an output buffer circuit that receives signals from the horizontal CCD shift register and that includes a first output stage and a second output stage, wherein the first output stage includes a source follower transistor that has a gate terminal that receives the signals from the horizontal CCD shift register, a current sink transistor, and a cascode transistor coupled in series between first and second power supply lines and wherein the cascode transistor is interposed between the source follower transistor and the current sink transistor.

12. The CCD image sensor defined in claim 11, wherein the current sink transistor is interposed between the cascode transistor and the second power supply line and wherein the source follower transistor is interposed between the cascode transistor and the first power supply line.

13. The CCD image sensor defined in claim 12, wherein the current sink transistor has a gate terminal that is coupled to the second power supply line.

14. The CCD image sensor defined in claim 13, wherein the first power supply line is a positive power supply line and the second power supply line is a ground power supply line.

15. The CCD image sensor defined in claim 13, wherein the second output stage includes an additional source follower transistor that has an additional gate terminal and wherein the additional gate terminal of the additional source follower transistor is coupled to a node that is interposed between the cascode transistor and the source follower transistor.

* * * * *